United States Patent
Lazaro Gallego et al.

(10) Patent No.: US 7,565,736 B2
(45) Date of Patent: Jul. 28, 2009

(54) PROCESS FOR MANUFACTURING PRINTED CIRCUIT BOARDS AND A MACHINE FOR THIS PURPOSE

(75) Inventors: Victor Lazaro Gallego, Santa Perpetua de Mogoda (ES); Jose Antonio Cubeiro Gonzalez, Santa Perpetua de Mogoda (ES)

(73) Assignee: Chemplate Materials, S.L., Santa Perpetua De Mogoda (ES)

( * ) Notice: Subject to any disclaimer, the term of this patent is extended or adjusted under 35 U.S.C. 154(b) by 391 days.

(21) Appl. No.: 10/549,040

(22) PCT Filed: Mar. 2, 2004

(86) PCT No.: PCT/EP2004/002072

§ 371 (c)(1),
(2), (4) Date: Sep. 15, 2005

(87) PCT Pub. No.: WO2004/086832

PCT Pub. Date: Oct. 7, 2004

(65) Prior Publication Data

US 2006/0213613 A1    Sep. 28, 2006

(30) Foreign Application Priority Data

Mar. 27, 2003  (ES)  ................................. 200300717

(51) Int. Cl.
*H05K 3/36*   (2006.01)
*H05K 3/20*   (2006.01)
*H05K 3/10*   (2006.01)

(52) U.S. Cl. .............................. 29/830; 29/831; 29/846

(58) Field of Classification Search .................... 29/831, 29/846, 848, 855, 830; 264/487; 425/3, 425/174.8 R; 174/254

See application file for complete search history.

(56) References Cited

U.S. PATENT DOCUMENTS 4,570,931 A * 2/1986 Martin ........................ 473/596

(Continued)

FOREIGN PATENT DOCUMENTS

JP        10013024    *  1/1998
JP        10-13024    * 10/1998

OTHER PUBLICATIONS

English abstract, TW 411732, Chen, Nov. 2000.*

*Primary Examiner*—A. Dexter Tugbang
*Assistant Examiner*—David P Angwin
(74) *Attorney, Agent, or Firm*—Sughrue Mion, PLLC

(57) ABSTRACT

Process and machine for manufacturing printed circuit boards wherein a press packet comprised of at least two press plates of metal material between which is arranged a printed circuit board composition formed by one or more metal sheets, by one or more layers of insulating material impregnated with polymerizable resins and/or by one or more printed circuit boards with an engraved Image of a circuit, are arranged between the press plates of a press and is pressed, subjecting said press packet to the action of a variable induction magnetic field which generates induced currents in each metal plate and sheet of the press packet, causing the heating of said plates and sheets, in turn causing the heating by thermal conduction of the layers of insulating material, melting and liquefying the resins in said layers of insulating material and adhering the insulating material to the metal sheets, so that, an raising the temperature even more, the polymerizable resins in the layers of insulating material are then polymerized, resulting, after the cooling of the press packet, in one or more rigid boards suitable for making printed electronic circuits. The machine to carry out the above process comprises a variable induction magnetic field generating device adapted to generate induced currents in the press packet's metal plates and sheets, causing them to heat, and means of controlling the Operation of the magnetic field generating device and controlling the temperature and pressure to which the press packet is subjected.

3 Claims, 2 Drawing Sheets

U.S. PATENT DOCUMENTS

| | | | |
|---|---|---|---|
| 4,681,649 A * | 7/1987 | Fazlin | 156/285 |
| 5,338,497 A * | 8/1994 | Murray et al. | 264/486 |
| 5,518,800 A * | 5/1996 | Okawa et al. | 428/151 |
| 5,647,940 A * | 7/1997 | Ceraso | 156/273.9 |
| 6,109,903 A * | 8/2000 | Inoue et al. | 425/174.8 R |
| 6,203,306 B1 * | 3/2001 | Inoue et al. | 425/174.8 R |

* cited by examiner

PROCESS FOR MANUFACTURING PRINTED CIRCUIT BOARDS AND A MACHINE FOR THIS PURPOSE

CROSS-REFERENCE TO RELATED APPLICATION

This application is a 371 of PCT/EP2004/002072, filed Mar. 2, 2004; the disclosure of which is incorporated herein by references.

TECHNICAL FIELD OF THE INVENTION

The aim of the invention is a process for manufacturing printed circuit boards and a machine to carry out said process.

BACKGROUND OF THE INVENTION

Printed circuit boards may take on multiple functional compositions, essentially concerning the number of metal sheets with an image of the circuit they form. So, for example, and among other forms, a board composition is initially formed from a metal sheet and a layer of insulating material impregnated with polymerizable resin on which, once the resins are polymerized and the board is cooled until it is hard, an engraved image of the circuit is formed on the metal sheet; another board composition is formed initially by two metal sheets between which there are one or more layers of insulating material; and a third composition for a printed circuit board is initially formed by two metal sheets between which there are two layers of insulating material separated by a printed circuit board provided on both faces with the already engraved image of the circuit.

In general, the process of polymerizing the resins in the layers of insulating material is carried out by subjecting the board whose composition has been disclosed to pressure at the same time as the temperature is raised until it reaches polymerization temperature. To do this, presses are used which are essentially differentiated by the method of heating the boards. One type of press includes means of heating arranged on the press plates of the press, so that the board is heated during pressing by thermal conduction. Another type of press includes means of heating based on passing an electric current supplied by a power source—generally direct current—through the board's sheets; in this case, the metal sheets are arranged continuously in order to make it possible for the electric current to pass through.

There are drawbacks with the types of press disclosed above. In presses wherein the means of heating are arranged on the press plates, the rate of temperature increase and the maximum temperatures that can be reached are very limited, which leads to low productivity. And, in presses where the means of heating are based on passing an electric current through the board's metal sheets, problems of electrical insulation between these and intermediate press plates arise.

EXPLANATION OF THE INVENTION

In the process for manufacturing printed circuit boards which is the object of the invention, a press packet comprising at least two press plates of metal material between which are arranged a printed circuit board composition formed by one or more metal sheets, one or more layers of insulating material impregnated with polymerizable resins and/or by one or more printed circuit boards with an engraved image of the circuit, are arranged between the press plates of a press, and it is pressed.

The process is essentially characterized in that, maintaining pressure on the packet, it comprises the steps of
i) subjecting the press packet to the action of a variable magnetic induction field which generates induced currents in each of the press packet's metal plates and sheets that heat said plates and sheets, heating, in turn, the layers of insulating material by thermal conduction;
ii) raising the temperature in the press packet until the resins in the layers of insulating material melt, liquefying and flowing, and providing adhesion between the layers of insulating material and the metal sheets;
iii) raising the temperature in the press packet until it exceeds that of the previous phase ii), so that the polymerizable resins in the layers of insulating material are polymerised;
iv) proceeding to cool the press packet until the layers of insulating material have hardened; and finally removing the press packet from between the press plates of the press and separating the press plates from the rigid board or boards obtained.

It is also characteristic of the process that the printed circuit board or boards with an engraved image of the circuit that may form part of the press packet composition are obtained according to the invention process.

Another characteristic of the process is that the metal sheets of the press packet are made of copper and/or aluminium.

According to another aspect of the invention, the layers of insulating material are formed from fibre glass paper and/or material impregnated with epoxy resins, polyamides, phenolic resins or fluoropolymers (PTFE).

In accordance with another characteristic of the invention process, the press packet is vacuum pressed.

The machine for the invention process comprises a closed structure provided with at least one press unit comprised of an upper press plate capable of vertical displacement in both directions, activated by means of propulsion, and by a lower press plate arranged coaxially with respect to the upper press plate, fixed to the press structure or capable of vertical displacement in both directions, the upper and lower plates lacking any device to provide heat and being adapted to receive a press packet between them, in accordance with the invention process.

In essence, the machine is characterized in that it comprises a variable induction magnetic field generating device, adapted to generate induced currents in the press packet's metal plates and sheets causing them to heat, and means of controlling the operation of the magnetic field generating device, which essentially affect the frequency and voltage applied to the device and the temperatures reached in the press packet, and means of controlling the pressure to which it is subjected.

According to a preferred embodiment, the machine comprises means for producing a vacuum inside the closed structure.

Another characteristic of the invention is that the machine is provided with a variable induction field generation device, without a magnetic core, formed by induction coils within which the upper press plate and the lower press plate are arranged.

The characteristics of the invention process and machine provide an innovative solution to the problems created by both the known processes and machines for manufacturing printed circuit boards. With the invention process, the heating of the press packet's metal sheets by electromagnetic induction has the following advantages: it produces uniform heating in the press packet, and it is virtually possible to achieve any rate of temperature increase of the press packet and any polymerization temperature necessary for the resins used. The temperature reached by the press packet is easily controlled and regulated by controlling the voltage and/or frequency of the electrical power applied to the circuit generating the magnetic field. It can be applied to any press packet composition without loss of performance concerning temperature or temperature regulation thereof; and it does not require intermediate press plates to be equipped with electrical insulation, as occurs in those embodiments of presses based on passing a current through the metal plates forming the press packet.

BRIEF DESCRIPTION OF THE DRAWINGS

By way of a non-limiting example, the attached drawings illustrate various compositions of printed circuit boards which can be obtained using the invention process as well as an embodiment of the machine for the invention process. In said drawings.

DETAILED DESCRIPTION OF THE DRAWINGS

In the following description of the invention process and machine therefor, identical reference numbers are used by way of simplification to designate identical or similar parts.

Figure 1:
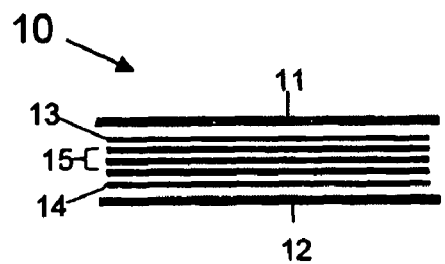
FIGS. 1 to 5 are schematic section views of respective compositions of press packets.

FIG. 1 represents a first press packet 10, comprising two press plates, an upper press plate 11 and a lower press plate 12 respectively, between which is arranged a printed circuit board composition formed by a first metal sheet 13 and a second metal sheet 14 separated from one other by three layers of insulating material 15 impregnated with polymerizable resins. Preferably, the metal layers 13 and 14 are made of copper and the layers of insulating material 15 are made of fibre glass material impregnated with epoxy resins.

Figure 2:
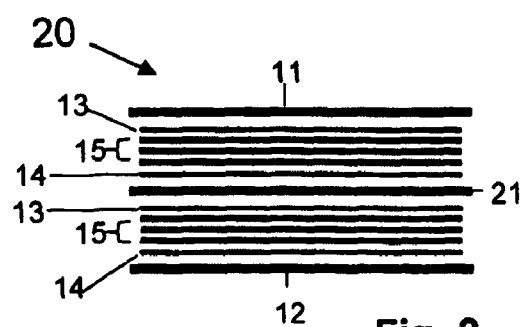

FIG. 2 represents a second press packet 20, comprising three press plates, an upper press plate 11, an intermediate press plate 21 and a lower press plate 12 respectively. Between the upper press plate 11 and the intermediate press plate 21 a printed circuit board composition is arranged formed by a first metal sheet 13 and a second metal sheet 14 separated from one other by three layers of insulating material 15 impregnated with polymerizable resins, all of them in a similar form to the printed circuit board composition detailed in FIG. 1, and a printed circuit board composition similar to the one arranged between the upper press plate 11 and the intermediate press plate 21 is arranged between the intermediate press plate 21 and the lower press plate 12.

Figure 3:
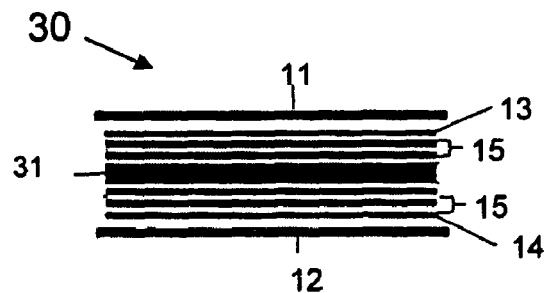

FIG. 3 represents a third press packet 30, comprising two press plates, an upper press plate 11 and a lower press plate 12 respectively, between which is arranged a printed circuit board composition formed by a first metal sheet 13, two layers of insulating material 15 impregnated with polymerizable resins, a printed circuit board 31 with its upper and lower faces provided with respective engraved circuit images, two layers of insulating material 15 impregnated with polymerizable resins and a second metal sheet 14.

Figure 4:
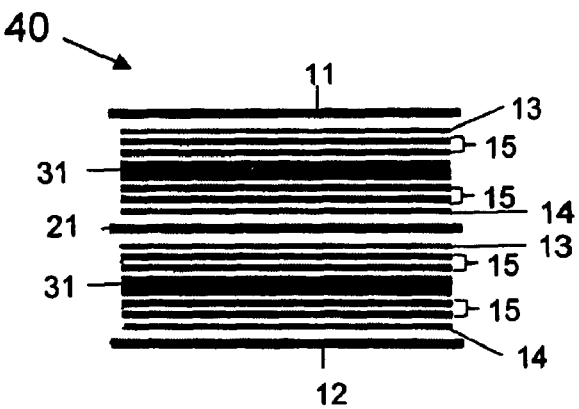

FIG. 4 represents a fourth press packet 40, comprising three press plates, an upper press plate 11, an intermediate press plate 21 and a lower press plate 12 respectively. Between the upper press plate 11 and the intermediate press plate 21, a printed circuit board composition is arranged formed by a first metal sheet 13, two layers of insulating material 15 impregnated with polymerizable resins, a printed circuit board 31 with its upper and lower faces provided with respective engraved circuit images, two layers of insulating material 15 impregnated with polymerizable resins and a second metal sheet 14, all this in a similar way to the printed circuit board composition detailed in FIG. 3; and a printed circuit board similar to the one arranged between the upper press plate 11 and the intermediate press plate 21 is arranged between the intermediate press plate 21 and the lower press plate 12.

Figure 5:
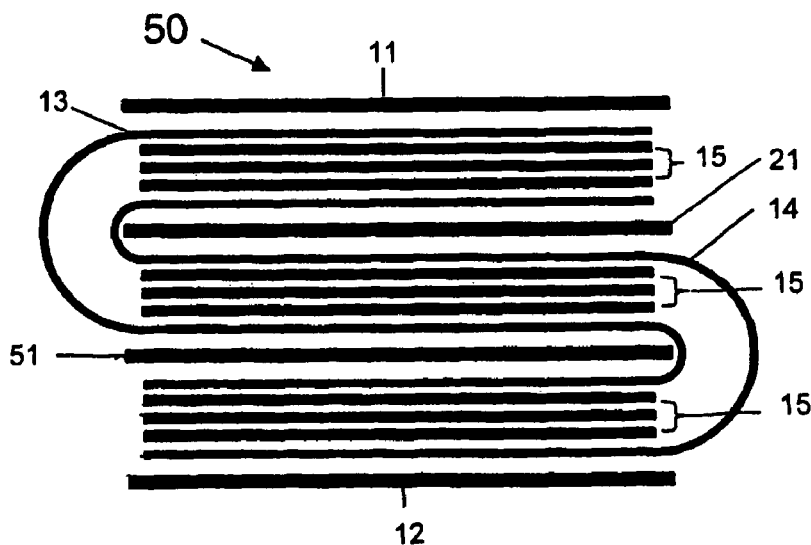

FIG. 5 represents a fifth press packet 50, comprising four press plates, an upper press plate 11, a first intermediate press plate 21, a second intermediate press plate 21 and a lower press plate 12 respectively. Between each pair of superimposed press plates, i.e. between press plates 11 and 21; 21 and 51; and 51 and 12, a printed circuit board composition is arranged, formed by a first metal sheet 13 and a second metal sheet 14 separated by three layers of insulating material 15 impregnated with polymerizable resins, all in a similar way to the printed circuit board compositions shown in FIGS. 1 and 2. It should be noted that the continuity between the first metal sheets 13 of each of the compositions and the continuity between the second metal sheets 14 is in no way necessary for the application of the invention process, but rather is given by way of example of the application of the invention process in cases where the press packets are formed in the way shown in FIG. 5, i.e. providing physical continuity between the first and second metal sheets.

The press plates used to carry out the process are made of metal material, such as aluminium or steel, and preferably magnetic steel.

Likewise, the result of the process, according to the invention, is optimum when the metal sheets used to produce the circuit boards are made of copper and/or aluminium.

The faces of the metal sheets intended to be in contact with the layers of insulating material are mechanically or chemically treated to increase their roughness and adherence to said layers of insulating material.

Alternatively, the surface of the metal sheets used and intended to be in contact with the layers of insulating material may be impregnated with adhesives or resins, also to increase the adherence of the metal sheets to the insulating material used.

As indicated above, in FIGS. 1 to 5, the application of the invention process has been represented by way of example, but there are many other possible configurations providing different embodiments of press packets. The invention process is applicable to all of them and, once the press packet has been formed and subjected to pressure by the machine of the invention, as will be described below by way of example, the following steps are taken: i) subjecting the press packet 10; 20; 30; 40; 50 to the action of a variable magnetic field that generates induced currents in the press plates 11; 12; 21; 51; in the metal sheets 13; 14 and in the printed circuit boards with images of circuits 31, heating them and, by thermal conduction, heating the layers of insulating material 15; ii) raising the temperature in the press packet 10; 20; 30; 40; 50 until the resins in the layers of insulating material 15 melt and said material adheres to the metal sheets; iii) raising the temperature of the press packet until the resins in the layers of insulating material 15 polymerize; and iv) proceeding to cool the press packet 10; 20; 30; 40; 50 until the layers of insulating material 15 harden, removing the press packet from between the press plates of the press and separating the press plates 11; 12; 21; 51 from the rigid board or boards obtained.

Figure 6:
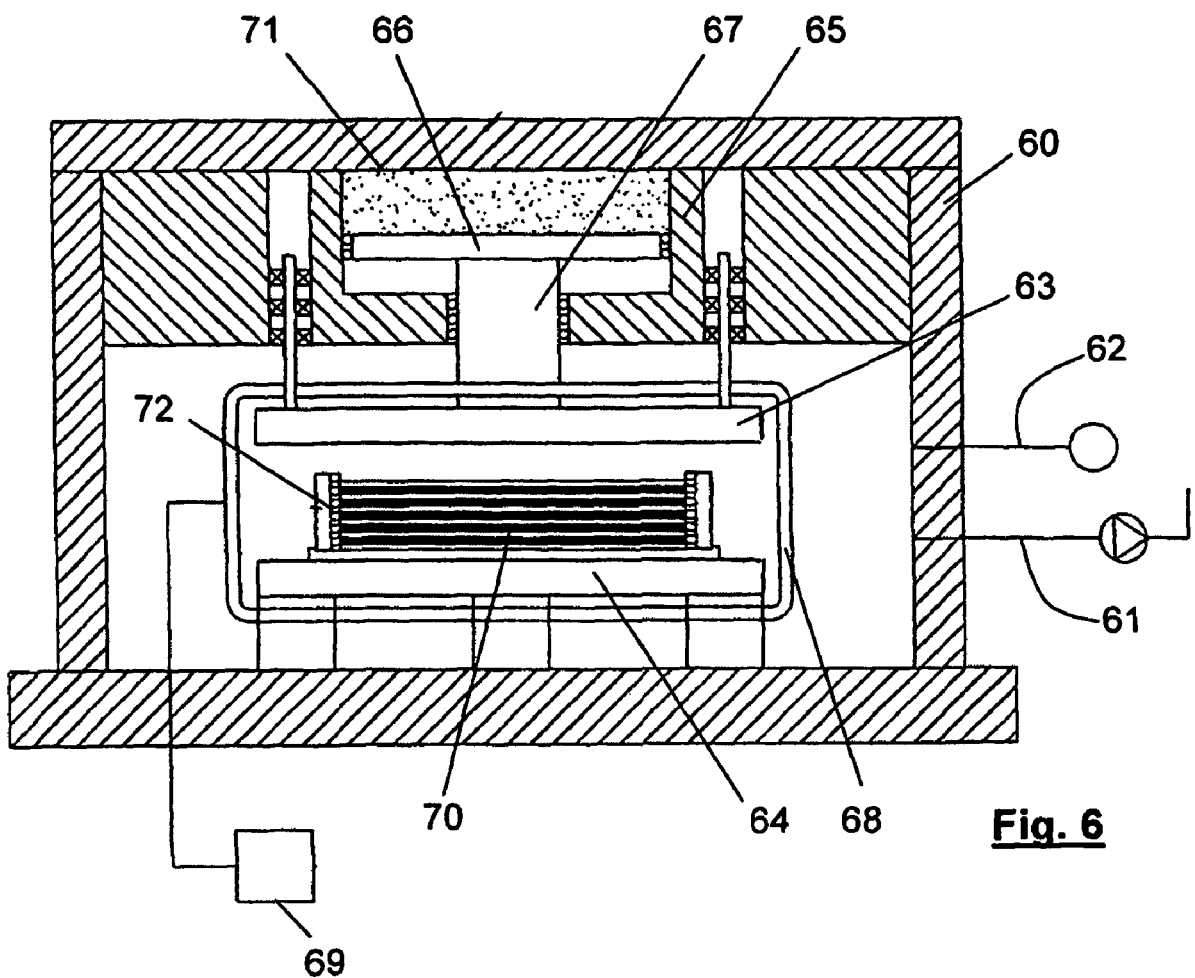
FIG. 6 is a diagrammatic section representing a machine for the invention process.

The machine of the invention represented diagrammatically in FIG. 6 comprises a closed structure 60 provided with means 61 for producing a vacuum inside it and a vacuum gauge 62. Inside the structure 60, there is a press unit comprising an upper press plate 63 capable of vertical displacement in both directions; a lower press plate 64, arranged coaxially with respect to the upper press plate 63, which in this example of embodiment is fixed to the structure 60, although it is understood that, as a variant of embodiment not represented, said lower plate may be capable of vertical displacement in both directions; and means of propulsion of the upper press plate 63 comprising a cylinder 65 provided with a piston 66 whose rod 67 is fixed to the upper press plate 63, all adapted to receive a press packet 70 between the upper plate 63 and the lower one 64, with a printed circuit board composition such as those given in FIGS. 1 to 5, or any other possible one. In this example of embodiment, a single press unit is shown, although it is understood that the closed structure 60 may contain more than one press unit, for example, two or more press units, and that their number will be dictated, among other factors, by the volume of printed circuit board production required.

FIG. 6 shows that the machine of the invention is provided with a variable induction magnetic field generation device 68, without a magnetic core, basically formed by induction coils within which the upper press plate 63, the press packet 70 and the lower press plate 64 are arranged. In addition, the magnetic field generation device 68 is provided with means of control 69, which are essentially intended to control the frequency and power supply voltage to these coils, which enables the temperatures reached by the press packet 70 to be altered.

The times and temperatures required to polymerize the resins which may be used in the manufacturing process of the boards depend on the composition of the resins and the pressure applied to the press packet. For this reason, the machine is provided with a pressure regulator 71 and with one or more temperature probes 72. The information obtained by the pressure regulator and temperature probes is used to govern the machine's means of control 69.

The invention claimed is:

1. A method of manufacturing printed circuit boards, the method comprising:
   a) arranging a press packet between press plates of a press, said press packet comprising a first metal plate and a second metal plate between which a printed circuit board composition is arranged, said printed circuit board composition comprising: a first layer of insulating material which is impregnated with polymerizable resins and disposed between a first metal sheet and a second metal sheet; and a first printed circuit board with engraved images of circuits,
   b) pressing the press packet between the press plates,
   c) applying a variable induction magnetic field in a parallel direction of the press packet so as to run generally parallel to largest planar surfaces of the first and second metal plates and the first and second metal sheets, said variable induction magnetic field generating an induced current in and thereby heating each of the first metal plate, the second metal plate, the first metal sheet, and the second metal sheet, causing, in turn, heating by thermal conduction of the first layer of insulating material;
   d) raising the temperature in the press packet until the resins in the first layer of insulating material melt, liquefy and flow, causing adhesion between the first layer of said insulating material and the first and second metal sheets;
   e) further raising the temperature in the press packet, so that the polymerizable resins in the first layer of insulating material are polymerised;
   f) cooling the press packet until the first layer of insulating material has hardened; and
   g) removing the press packet from between the press plates and separating the first and second metal plates from the press packet to obtain a rigid board.

2. The method of claim 1 further comprising performing the method in an apparatus comprising:
   an upper press plate, from among the press plates, which is capable of vertical displacement;
   a lower press plate, from among the press plates, which is arranged coaxially with respect to the upper press plate, said lower plate being capable of vertical displacement, the upper and lower plates lacking any device which induces a current in the first and second metal plates to provide heat to the press packet and being adapted to receive a press packet between them in accordance with the process in claim 1;
   a variable induction magnetic field generation device adapted to induce current causing heating in the first and second metal plates and in the first and second metal sheets of the press packet; and
   a means of controlling the frequency and voltage applied to the electromagnetic field generation device, the temperature of the press packet, and the pressure to which the press packet is subjected.

3. The method according to claim 2, further comprising temperature probes adapted to be mounted on the press packet.

\* \* \* \* \*